US012801028B2

(12) United States Patent
Suwa et al.

(10) Patent No.: US 12,801,028 B2
(45) Date of Patent: Nov. 17, 2026

(54) LASER PROCESSING SYSTEM AND LASER PROCESSING METHOD

(71) Applicant: Gigaphoton Inc., Tochigi (JP)

(72) Inventors: Akira Suwa, Oyama (JP); Junichi Fujimoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 99 days.

(21) Appl. No.: 18/937,972

(22) Filed: Nov. 5, 2024

(65) Prior Publication Data

US 2025/0199416 A1 Jun. 19, 2025

(30) Foreign Application Priority Data

Dec. 15, 2023 (JP) ................................ 2023-212513

(51) Int. Cl.
*G03F 7/00* (2006.01)
*G02B 13/00* (2006.01)
*G02B 26/10* (2006.01)

(52) U.S. Cl.
CPC ..... *G03F 7/70358* (2013.01); *G02B 13/0005* (2013.01); *G02B 26/101* (2013.01); *G03F 7/70025* (2013.01); *G03F 7/70041* (2013.01); *G03F 7/70316* (2013.01); *G03F 7/70716* (2013.01)

(58) Field of Classification Search
CPC ............. G03F 7/70358; G03F 7/70025; G03F 7/70041; G03F 7/70316; G03F 7/70716; G02B 13/0005; G02B 26/101; B23K 26/0648; B23K 26/362; B23K 26/702
See application file for complete search history.

(56) References Cited

U.S. PATENT DOCUMENTS 8,426,768 B2 * 4/2013 Rekowski ............ B23K 26/082 219/121.81
9,527,159 B2 * 12/2016 Frankel .............. B23K 26/0853
11,860,091 B2 * 1/2024 Kavosh .............. B23K 26/0622
2002/0064345 A1 5/2002 Kikuchi et al.
2003/0047695 A1 * 3/2003 Zik .................... B23K 26/0846 250/559.32

FOREIGN PATENT DOCUMENTS

JP 2004-230441 A 8/2004

* cited by examiner

*Primary Examiner* — Hung V Nguyen
(74) *Attorney, Agent, or Firm* — Studebaker Brackett PLLC

(57) ABSTRACT

A laser processing system for forming recesses by radiating pulse laser light to processing receiving regions separate from each other in a first direction on a surface of a workpiece includes a gas laser apparatus that outputs the pulse laser light, a mover that moves a radiation receiving region on the surface that is irradiated with the pulse laser light in the first direction, and a first galvanometric scanner that changes the optical path of the pulse laser light to move the radiation receiving region in the first direction. The mover moves the radiation receiving region such that the moved radiation receiving region overlaps with a part of the radiation receiving region irradiated immediately before. The first galvanometric scanner moves the radiation receiving region such that the moved radiation receiving region is located within the processing receiving region different from the processing receiving region irradiated immediately before.

13 Claims, 9 Drawing Sheets

LASER PROCESSING SYSTEM AND LASER PROCESSING METHOD

CROSS-REFERENCE TO RELATED APPLICATIONS

The present application claims the benefit of Japanese Patent Application No. 2023-212513, filed on Dec. 15, 2023, the entire contents of which are hereby incorporated by reference.

BACKGROUND

1. Technical Field

The present disclosure relates to a laser processing system and a laser processing method.

2. Related Art

In recent years, a semiconductor exposure apparatus is required to improve the resolution thereof as semiconductor integrated circuits are increasingly miniaturized and highly integrated. To this end, reduction in the wavelength of light emitted from a light source for exposure is underway. For example, a KrF excimer laser apparatus, which outputs laser light having a wavelength of about 246.0 nm, and an ArF excimer laser apparatus, which outputs laser light having a wavelength of about 193.4 nm, are used as a gas laser apparatus for exposure.

The light from spontaneously oscillating KrF and ArF excimer laser apparatuses has a wide spectral linewidth ranging from 350 pm to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light output from the gas laser apparatus needs to be narrow enough to make the chromatic aberrations negligible. To this end, a line narrowing module (LNM) including a line narrowing element (such as etalon or grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JP-A-2004-230441
[PTL 2] U.S. Patent application Publication No. 2002/0064345

SUMMARY

A laser processing system according to an aspect of the present disclosure may be a laser processing system for forming plural recesses by radiating pulse laser light to plural processing receiving regions separate from each other in a first direction on a surface of a workpiece, the system including a gas laser apparatus configured to output the pulse laser light, a mover configured to move a radiation receiving region on the surface that is irradiated with the pulse laser light in the first direction, and a first galvanometric scanner configured to change an optical path of the pulse laser light to move the radiation receiving region in the first direction, the mover moving the radiation receiving region in such a way that the moved radiation receiving region overlaps with a part of the radiation receiving region irradiated with the pulse laser light immediately before, and the first galvanometric scanner moving the radiation receiving region in such a way that the moved radiation receiving region is located within the processing receiving region different from the processing receiving region irradiated with the pulse laser light immediately before.

A laser processing method according to another aspect of the present disclosure may be a laser processing method for forming plural recesses by radiating pulse laser light to plural processing receiving regions separate from each other in a first direction on a surface of a workpiece, the method including a first process of causing a mover configured to move in the first direction a radiation receiving region on the surface that is irradiated with the pulse laser light to move the radiation receiving region in such a way that the moved radiation receiving region overlaps with a part of the radiation receiving region irradiated with the pulse laser light immediately before within the processing receiving region irradiated with the pulse laser light immediately before, and a second process of causing a first galvanometric scanner configured to change an optical path of the pulse laser light to move the radiation receiving region in the first direction to move the radiation receiving region in such a way that the moved radiation receiving region is located within the processing receiving region different from the processing receiving region irradiated with the pulse laser light immediately before.

BRIEF DESCRIPTION OF DRAWINGS

Embodiments of the present disclosure will be described below only by way of example with reference to the accompanying drawings.

DETAILED DESCRIPTION

Figure 1:
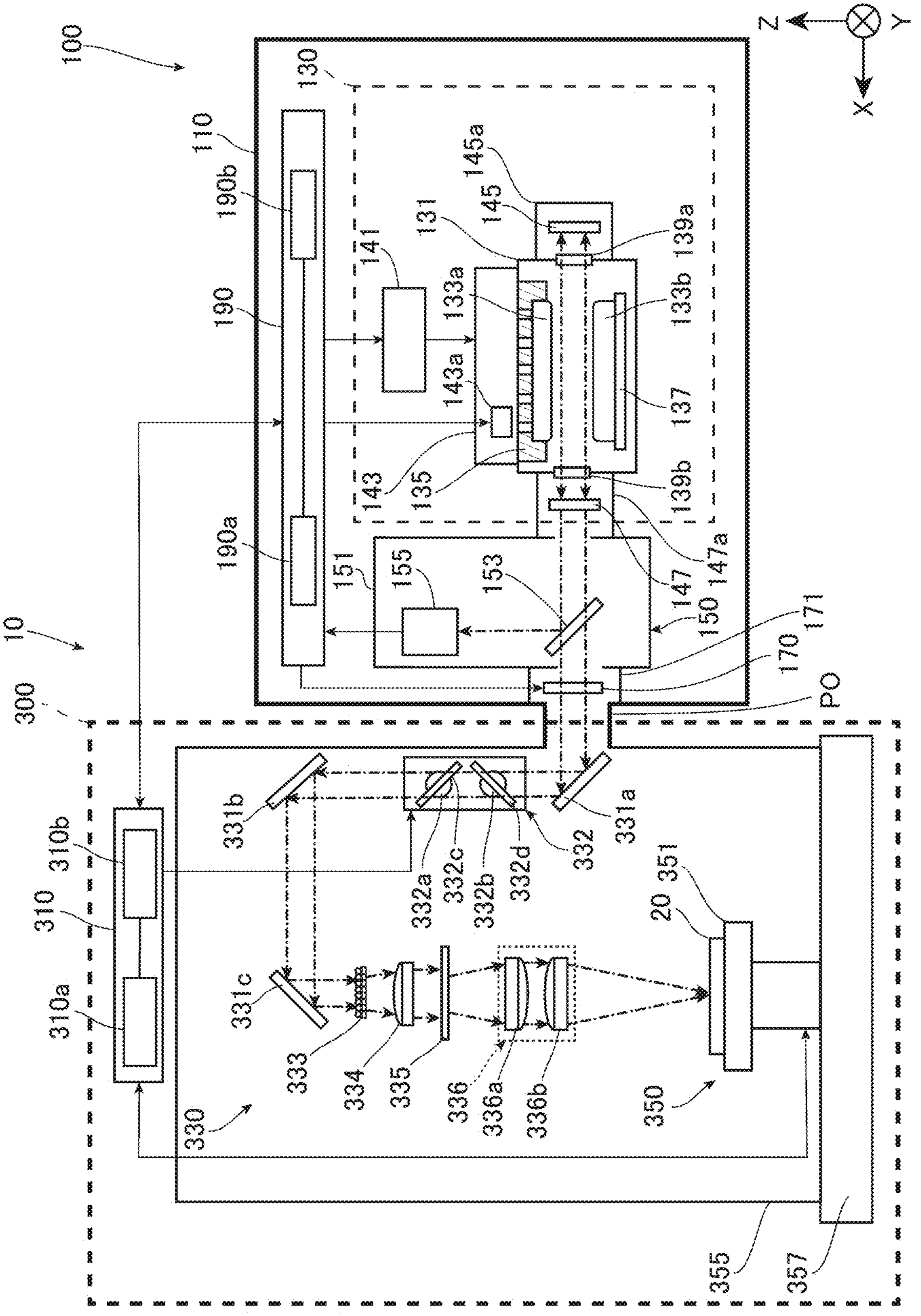
FIG. 1 is a diagrammatic view showing an example of a schematic configuration of the entirety of a laser processing system according to Comparative Example.

1. Description of laser processing system and laser processing method according to Comparative Example
1.1 Configuration
1.2 Operation
1.3 Problems
2. Description of laser processing system and laser processing method according to first embodiment
2.1 Configuration
2.2 Operation
2.3 Effects and advantages
3. Description of laser processing system and laser processing method according to second embodiment
3.1 Configuration
3.2 Operation
3.3 Effects and advantages
4. Description of laser processing system and laser processing method according to third embodiment
4.1 Configuration
4.2 Operation
4.3 Effects and advantages Embodiments of the present disclosure will be described below in detail with reference to the drawings. The embodiments described below show some examples of the present disclosure and are not intended to limit the content of the present disclosure. Furthermore, all configurations and operations described in the embodiments are not necessarily essential as configurations and operations in the present disclosure. The same component has the same reference character, and no redundant description of the same component will be made.

1. Description of Laser Processing System and Laser Processing Method According to Comparative Example

1.1 Configuration

A laser processing system and a laser processing method according to Comparative Example will be described. Comparative Example in the present disclosure is a form that the applicant is aware of as known only by the applicant, and is not a publicly known example that the applicant is self-aware of.

FIG. 1 is a diagrammatic view showing an example of a schematic configuration of the entirety of a laser processing system 10 according to the present example. The laser processing system 10 according to the present example primarily includes a gas laser apparatus 100, a laser processing apparatus 300, and an optical path tube PO, which connects the gas laser apparatus 100 and the laser processing apparatus 300 to each other. The description below will be made under the following definitions: The direction parallel to the direction of the optical axis of laser light incident on a workpiece 20 is a Z direction; a first direction perpendicular to the Z direction is an X direction; and a second direction perpendicular to the X and Z directions is a Y direction. The Z direction is also the height direction of the workpiece 20.

The gas laser apparatus 100 according to the present example is an ArF excimer laser apparatus using a mixture gas containing argon (Ar), fluorine ($F_2$), and neon (Ne). The gas laser apparatus 100 outputs laser light having a center wavelength of about 193.4 nm. Note that the gas laser apparatus 100 may instead be a gas laser apparatus other than the ArF excimer laser apparatus, for example, a KrF excimer laser apparatus using a mixture gas containing krypton (Kr), $F_2$, and Ne. In this case, the gas laser apparatus 100 outputs laser light having a center wavelength of about 246.0 nm. The mixture gas containing Ar, $F_2$, and Ne and the mixture gas containing Kr, $F_2$, and Ne, the constituent elements in each of the mixture gases forming a laser medium, are each called a laser gas in some cases.

The gas laser apparatus 100 primarily includes an enclosure 110, a laser oscillator 130, a monitor module 150, a shutter 170, and a laser processor 190, the latter four components of which are arranged in the internal space of the enclosure 110.

The laser oscillator 130 includes a laser chamber 131, a charger 141, a pulse power module 143, a rear mirror 145, and an output coupling mirror 147. FIG. 1 shows the internal configuration of the laser chamber 131 viewed in a direction substantially perpendicular to the traveling direction of the laser light.

The laser chamber 131 has an internal space where the laser medium in the laser gas described above is excited to generate light. The light travels to windows 139*a* and 139*b*, which will be described later. The laser gas is supplied to the internal space of the laser chamber 131 from a laser gas supply source that is not shown via a pipe that is not shown. The laser gas in the laser chamber 131 is caused to flow through a halogen filter that removes the $F_2$ gas from the laser gas and otherwise processed, and the removed $F_2$ gas is exhausted by an exhaust pump that is not shown into the enclosure 110 through a pipe that is not shown.

A pair of electrodes 133*a* and 133*b* are arranged so as to face each other in the internal space of the laser chamber 131, and the longitudinal direction of the electrodes 133*a* and 133*b* extends along the traveling direction of the light. The electrodes 133*a* and 133*b* are discharge electrodes that produce glow discharge to excite the laser medium. In the present example, the electrode 133*a* is the cathode, and the electrode 133*b* is the anode.

The electrode 133*a* is supported by an electrical insulator 135. The electrical insulator 135 closes an opening formed in the laser chamber 131. Electrical conductors that are not shown are embedded in the electrical insulator 135, and the electrical conductors apply a high voltage supplied from the pulse power module 143 to the electrode 133*a*. The electrode 133*b* is supported by a return plate 137, and the return plate 137 is connected to the inner surface of the laser chamber 131 via wiring that is not shown.

The charger 141 is a DC power supply that supplies a predetermined voltage to charge a charging capacitor that is not shown but is provided in the pulse power module 143. The pulse power module 143 includes a switch 143*a* controlled by the laser processor 190. When the switch 143*a* is changed from the turned-off state to the turned-on state, the pulse power module 143 generates a high pulse voltage from the electrical energy held in the charger 141 and applies the high voltage to the space between the electrodes 133*a* and 133*b*.

When the high voltage is applied to the space between the electrodes 133*a* and 133*b*, discharge occurs between the electrodes 133*a* and 133*b*. The energy of the discharge excites the laser medium in the laser chamber 131, and the excited laser medium emits light when transitioning to the ground state.

The laser chamber 131 is provided with the windows 139*a* and 139*b*. The window 139*a* is located at one end of the laser chamber 131 in the traveling direction of the laser light, and the window 139*b* is located at the other end in the traveling direction, so that the windows 139*a* and 139*b* sandwich the space between the electrodes 133*a* and 133*b*.

The windows 139*a* and 139*b* each incline with respect to the traveling direction of the laser light by Brewster's angle, and therefore suppress reflection of a P-polarized component of the laser light. The laser light as a result of laser oscillation that will be described later exits out of the laser chamber 131 via the windows 139*a* and 139*b*. Since the high pulse voltage is applied to the space between the electrodes 133*a* and 133*b* by the pulse power module 143 as described above, the laser light is pulse laser light.

The rear mirror 145 is disposed in the internal space of an enclosure 145*a* connected to the one end of the laser chamber 131, and reflects the laser light output via the window 139*a* back to the laser chamber 131. The output coupling mirror 147 is disposed in the internal space of an optical path tube 147*a* connected to the other end of the laser chamber 131, transmits part of the laser light output via the window 139*b*, and reflects the other part of the laser light back into the internal space of the laser chamber 131. The rear mirror 145 and the output coupling mirror 147 thus constitute a Fabry-Perot laser resonator, and the laser chamber 131 is disposed in the optical path of the laser resonator.

The monitor module 150 is disposed in the optical path of the laser light output via the output coupling mirror 147. The monitor module 150 includes, for example, an enclosure 151, a beam splitter 153, and a photosensor 155, the latter two components of which are disposed in the internal space of the enclosure 151. An opening is formed in the enclosure 151, and the internal space of the enclosure 151 communicates with the internal space of the optical path tube 147*a* via the opening.

The beam splitter 153 transmits part of the laser light output via the output coupling mirror 147 toward the shutter 170, and reflects the other part of the laser light toward the light receiving surface of the photosensor 155. The photosensor 155 measures energy E of the laser light incident on the light receiving surface. The photosensor 155 outputs a signal representing the measured energy E to the laser processor 190.

The laser processor 190 in the present disclosure is a processing apparatus including a storage 190*a*, which stores a control program, and a CPU (central processing unit) 190*b*, which executes the control program. The laser processor 190 is particularly configured or programmed to perform a variety of types of processing described in the present disclosure. The laser processor 190 controls the entire gas laser apparatus 100.

The laser processor 190 transmits and receives a variety of signals to and from a laser processing processor 310 of the laser processing apparatus 300. For example, the laser processor 190 receives from the laser processing processor 310 a signal representing a light emission trigger Tr, which will be described later, target energy Et, which will be described later, and other pieces of information. The laser processor 190 controls a charging voltage applied to the charger 141 based on the energy E received from the photosensor 155 and the target energy Et received from the laser processing processor 310. Controlling the charging voltage controls the energy of the laser light. The laser processor 190 also transmits a command signal that turns on or off the switch 143*a* to the pulse power module 143. Furthermore, the laser processor 190 is electrically connected to the shutter 170 and controls opening and closing of the shutter 170.

The laser processor 190 closes the shutter 170 until a difference ΔE between the energy E received from the monitor module 150 and the target energy Et received from the laser processing processor 310 falls within an allowable range. When the difference ΔE falls within the allowable range, the laser processor 190 transmits a reception preparation completion signal indicating that the laser processor 190 is ready to receive the light emission trigger Tr to the laser processing processor 310. Upon reception of the reception preparation completion signal, the laser processing processor 310 transmits a signal representing the light emission trigger Tr to the laser processor 190, and upon reception of the signal representing the light emission trigger Tr, the laser processor 190 opens the shutter 170. The light emission trigger Tr is a timing signal or an external trigger that is specified by a predetermined repetition frequency f of the laser light and a predetermined number of pulses P, and in response to the light emission trigger Tr, the laser processing processor 310 causes the laser oscillator 130 to undergo laser oscillation. The repetition frequency f of the laser light is, for example, higher than or equal to 1 kHz but lower than or equal to 10 kHz.

The shutter 170 is disposed in the optical path of the laser light having passed through the beam splitter 153 of the monitor module 150 and having passed through an opening of the enclosure 151 that is formed on the side thereof opposite from the side to which the optical path tube 147*a* is connected. The shutter 170 is also disposed in the internal space of an optical path tube 171, and the optical path tube 171 is connected to the enclosure 151 so as to surround the opening mentioned above, and communicates with the enclosure 151. The optical path tube 171 further communicates with the laser processing apparatus 300 via the above-mentioned opening of the enclosure 110 and the optical path tube PO.

The internal spaces of the optical path tubes 171 and 147*a*, and the internal spaces of the enclosures 151 and 145*a* are filled with a purge gas. The purge gas contains an inert gas such as nitrogen ($N_2$). The purge gas is supplied from a purge gas supply source that is not shown into the internal spaces of the optical path tubes 171 and 147*a* and the internal spaces of the enclosures 151 and 145*a* through a pipe that is not shown.

The laser processing apparatus 300 includes the laser processing processor 310, an optical system 330, a stage 350, an enclosure 355, and a frame 357 as primary components. The optical system 330 and the stage 350 are disposed in the internal space of the enclosure 355. The enclosure 355 is fixed to the frame 357. The optical path tube PO is connected to the enclosure 355, and the internal space of the enclosure 355 communicates with the internal space of the optical path tube PO via an opening formed in the enclosure 355, so that the laser light having passed through the region from which the shutter 170 has been retracted enters the enclosure 355.

The laser processing processor 310 is a processing apparatus including a storage 310*a*, which stores a control program, and a CPU 310*b*, which executes the control program. The laser processing processor 310 is particularly configured or programmed to perform a variety of types of processing described in the present disclosure. The laser processing processor 310 controls the entire laser processing apparatus 300.

The optical system 330 includes highly reflective mirrors 331*a*, 331*b*, and 331*c*, an attenuator 332, a fly-eye lens 333, a condenser lens 334, a mask 335, and a projection optical system 336. Each of the components of the optical system 330 is fixed to a holder that is not shown, and is disposed at a predetermined position in the enclosure 355.

The highly reflective mirrors 331*a*, 331*b*, and 331*c* are each formed, for example, of a transparent substrate made of synthetic quartz or calcium fluoride and having a surface coated with a reflective film that reflects the laser light at high reflectance. The highly reflective mirror 331*a* reflects the laser light incident from the gas laser apparatus 100 toward the attenuator 332. The highly reflective mirror 331*b* reflects the laser light from the attenuator 332 toward the highly reflective mirror 331*c*. The highly reflective mirror 331*c* reflects the laser light from the highly reflective mirror 331*b* toward the fly-eye lens 333.

The attenuator 332 is disposed in the optical path between the highly reflective mirror 331*a* and the highly reflective mirror 331*b*. The attenuator 332 includes, for example, rotary stages 332*a* and 332*b*, and partially reflective mirrors 332*c* and 332*d* fixed to the rotary stages 332*a* and 332*b*, respectively. Each of the rotary stages 332*a* and 332*b* is electrically connected to the laser processing processor 310, and rotates around the Y-axis in accordance with a control signal from the laser processing processor 310. When the rotary stages 332*a* and 332*b* rotate, the partially reflective mirrors 332*c* and 332*d* also rotate, respectively. The partially reflective mirrors 332*c* and 332*d* are optical elements having transmittance that changes in accordance with the angles of incidence of the laser light incident on the partially reflective mirrors 332*c* and 332*d*. The angles of rotation of the partially reflective mirrors 332*c* and 332*d* around the Y-axis are so adjusted by the rotation of the rotary stages 332*a* and 332*b* that the angles of incidence of the laser light incident on the partially reflective mirrors 332*c* and 332*d* coincide with each other and the transmittance of the partially reflective mirrors 332*c* and 332*d* have desired transmittance. The laser light from the highly reflective mirror 331*a* is therefore attenuated so as to have desired energy and passes through the attenuator 332.

The fly-eye lens 333 is a lens including plural lenses juxtaposed, for example, in a honeycomb shape, and is also called an optical integration lens. The fly-eye lens 333 is so disposed that the light-exiting-side focal plane of the fly-eye lens 333 coincides with the light-incident-side focal plane of the condenser lens 334, so that the fly-eye lens 333 outputs the laser light in such a way that the laser light incident on the condenser lens 334 has a uniform energy density.

The condenser lens 334 is a lens that collects the laser light output from the fly-eye lens 333, and is so disposed that the light-exiting-side focal plane of the condenser lens 334 coincides with the upper surface of the mask 335.

The mask 335 is, for example, a plate-shaped member that has a transmission hole through which part of the laser light passes and blocks the other part of the laser light. In the present example, the transmission hole is formed of a rectangular hole, and the laser light having passed through the transmission hole has a rectangular outer shape elongated in the Y direction.

The projection optical system 336 includes, for example, a collimator lens 336*a* and a light collecting lens 336*b*. The collimator lens 336*a* outputs the laser light from the mask 335 as parallelized light. The light collecting lens 336*b* collects the laser light from the collimator lens 336*a* and brings the collected laser light into focus at the surface of the workpiece 20.

The stage 350 is disposed at the bottom surface of the enclosure 355 and includes a table 351. The stage 350 can move the table 351 in the X, Y, and Z directions in response to a control signal from the laser processing processor 310, and adjust the position of the table 351 through the movement.

The table 351 supports the workpiece 20. The principal surface of the table 351 is substantially perpendicular to the Z-axis and substantially extends along the XY plane. The front and rear surfaces of the workpiece 20 are therefore substantially perpendicular to the Z-axis and located substantially along the XY plane. The thus configured stage 350 can move the workpiece 20 via the table 351 to adjust the position of the workpiece 20 in such a way that the workpiece 20 is irradiated at a desired position with plural pulses of the laser light output from the optical system 330. That is, the stage 350 is a mover that can move a radiation receiving region on the surface of the workpiece 20 that is irradiated with the laser light in the X and Y directions perpendicular to the direction in which the laser light is radiated.

The workpiece 20 is a target object that undergoes laser processing through the radiation of the laser light. The workpiece 20 may, for example, be a light-transmissive, plate-shaped member that eventually forms an optical waveguide substrate. Examples of the material of which the plate-shaped member is made may include polyimide resin and polynorbornene resin.

An inert gas constantly flows in the internal space of the enclosure 355 during the period for which the laser processing system 10 is in operation. The inert gas is, for example, a nitrogen gas. The enclosure 355 is provided with a suction port which is not shown but via which the inert gas is sucked into the enclosure 355, and a discharge port which is not shown but via which the inert gas is discharged out of the enclosure 355. An intake pipe and a discharge pipe that are not shown are connected to the suction port and the discharge port, respectively. A gas supply source that is not shown but supplies the inert gas is connected to the suction port via a pipe. The inert gas supplied via the suction port also flows through the optical path pipe PO, which communicates with the enclosure 355.

1.2 Operation

The operation of the laser processing system 10 and the laser processing method according to Comparative Example will next be described.

In the gas laser apparatus 100, before the gas laser apparatus 100 outputs the laser light, the internal spaces of the optical path tubes 147*a*, 171, and PO and the internal spaces of the enclosures 145*a* and 151 are filled with the purge gas from the purge gas supply source, which is not shown. The laser gas is supplied from the laser gas supply source, which is not shown, into the internal space of the laser chamber 131. In the laser processing apparatus 300, the inert gas such as a nitrogen gas flows in the internal space of the enclosure 355.

In the laser processing apparatus 300, the workpiece 20 is supported by the upper surface of the table 351. The laser processing processor 310 sets the following coordinates to the stage 350: the coordinates X, Y, and Z of an initial radiation receiving position to which the laser light is radiated to form a processing receiving portion. The stage 350 thus moves the table 351 along with the workpiece 20 to the set initial radiation receiving position. Note that the radiation receiving position is the position of the center of the radiation receiving region irradiated with the laser light.

After the table 351 moves, the laser processing processor 310 controls the transmittance of the attenuator 332 of the optical system 330 and the gas laser apparatus 100 in such a way that the laser light to be radiated to the workpiece 20 has a desired fluence F necessary for the laser processing. The fluence F is defined as the value as a result of division of the energy of the laser light by the cross-sectional area of the laser light that is perpendicular to the optical axis of the laser light.

The laser processor 190 closes the shutter 170 and drives the charger 141. The laser processor 190 turns on the switch 143*a* of the pulse power module 143. The pulse power module 143 thus applies the high pulse voltage derived from the electrical energy held in the charger 141 to the space between the electrodes 133*a* and 133*b*. The high voltage causes discharge to occur between the electrodes 133*a* and 133*b*, and the laser medium contained in the laser gas between the electrodes 133*a* and 133*b* is excited, and when the laser medium returns to the ground state, the laser medium emits light. The light resonates between the rear mirror 145 and the output coupling mirror 147, and the light is amplified whenever passing through the discharge space in the internal space of the laser chamber 131, resulting in laser oscillation. Part of the laser light then passes as the pulse laser light through the output coupling mirror 147 and travels to the beam splitter 153.

Part of the laser light having traveled to the beam splitter 153 is reflected off the beam splitter 153 and received by the photosensor 155. The photosensor 155 measures the energy E of the received laser light and outputs the signal representing the measured energy E to the laser processor 190. The laser processor 190 controls the charging voltage in such a way that the difference ΔE between the energy E and the target energy Et falls within the allowable range, and after the difference ΔE falls within the allowable range, the laser processor 190 transmits the reception preparation completion signal, which indicates that the laser processor 190 is ready to receive the light emission trigger Tr, to the laser processing processor 310.

Upon reception of the reception preparation completion signal, the laser processing processor 310 transmits the light emission trigger Tr to the laser processor 190. When the laser processor 190 opens the shutter 170 in synchronization with the reception of the light emission trigger Tr, the laser light having passed through the region from which the shutter 170 has been retracted enters the laser processing apparatus 300. The laser light is, for example, the pulse laser light having the center wavelength of 193.4 nm.

The laser light having entered the laser processing apparatus 300 is radiated to the mask 335 via the highly reflective mirror 331*a*, the attenuator 332, the highly reflective mirrors 331*b* and 331*c*, the fly-eye lens 333, and the condenser lens 334. At this point in time, the laser light is radiated onto the mask 335 in the form of Koehler illumination. At the mask 335, part of the laser light passes through the transmission hole, which shapes the laser light in a rectangular outer shape elongated in the Y direction, and the other part of the laser light is blocked. The laser light having passed through the mask 335 is parallelized by the collimator lens 336*a* of the projection optical system 336, and is focused at the surface of the workpiece 20 by the light collecting lens 336*b*.

The laser light is radiated to the workpiece 20 in accordance with the light emission trigger Tr specified by the repetition frequency f and the number of pulses P both required for the laser processing. The laser light radiation causes ablation in the vicinity of the surface of the workpiece 20, which produces defects. The workpiece 20 is thus processed at the processing receiving portion, so that a recess is formed. In the present example, plural processing receiving portions separate from each other are processed, so that plural recesses are formed.

Figure 2:
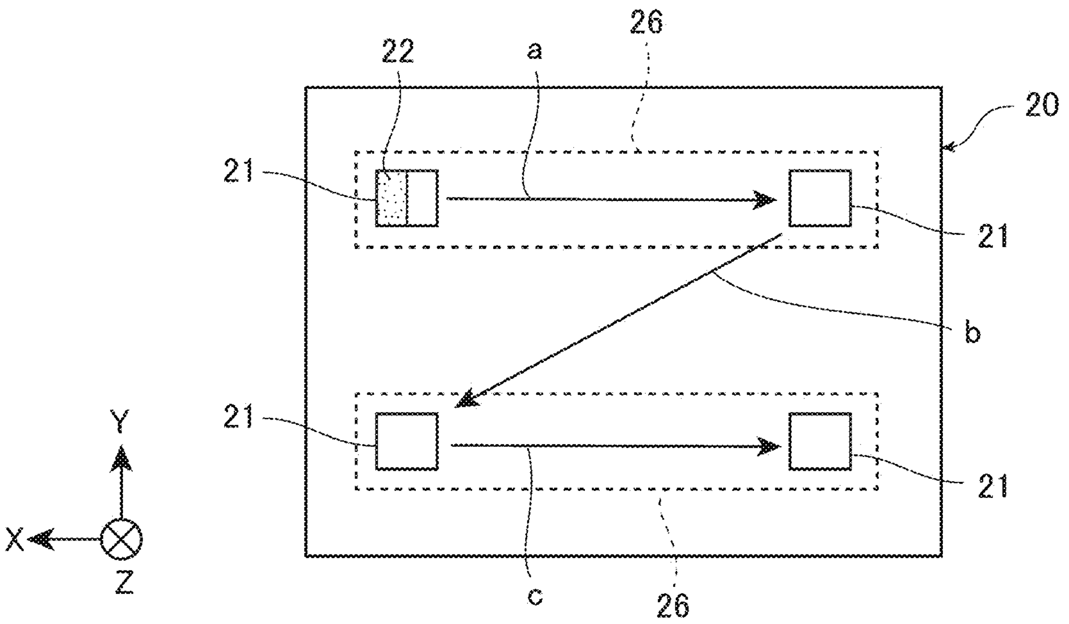
FIG. 2 describes the order of processing performed on a surface of a workpiece.

FIG. 2 describes the order of processing performed on the surface of the workpiece 20. Processing receiving regions 21 shown in FIG. 2 are regions to be irradiated with the laser light and therefore processed. Sets 26 each including plural processing receiving regions 21 separate from each other in the X direction are arranged in the Y direction. In the present example, the number of sets 26 is two and the number of processing receiving regions 21 in each of the sets 26 is two by way of example, but the number of sets 26 and the number of processing receiving regions 21 in each of the sets 26 are each not limited to a specific number.

The processing receiving regions 21 in the present example each have a substantially quadrangular outer shape having opposite sides facing each other in the X direction and opposite sides facing each other in the Y direction. The width of each of the processing receiving regions 21 in the Y direction is approximately equal to the width of a radiation receiving region 22 in the Y direction, which is irradiated with the laser light in one pulse, and the width of each of the processing receiving regions 21 in the X direction is greater than the width of the radiation receiving region 22 in the X direction, approximately twice the width of the latter. Radiating the laser light multiple times therefore causes the entirety of each of the processing receiving regions 21 to be irradiated with the laser light. In FIG. 2, to distinguish the processing receiving regions 21 and the radiation receiving region 22 from each other, the radiation receiving region 22 is hatched with plural dots.

Figure 3:
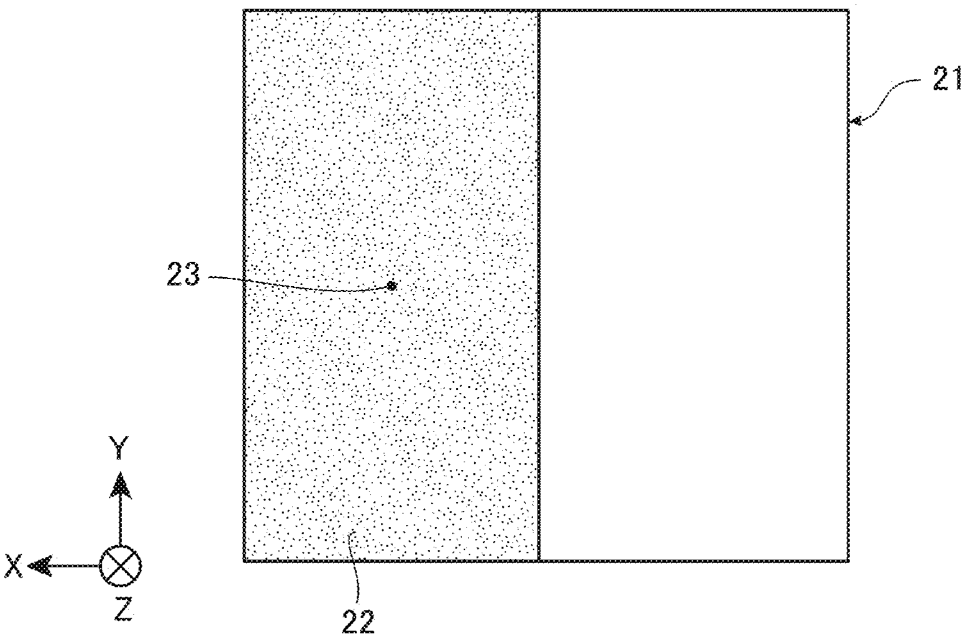
FIG. 3 shows an example of a radiation receiving region in the first radiation to a processing receiving region.
Figure 4:
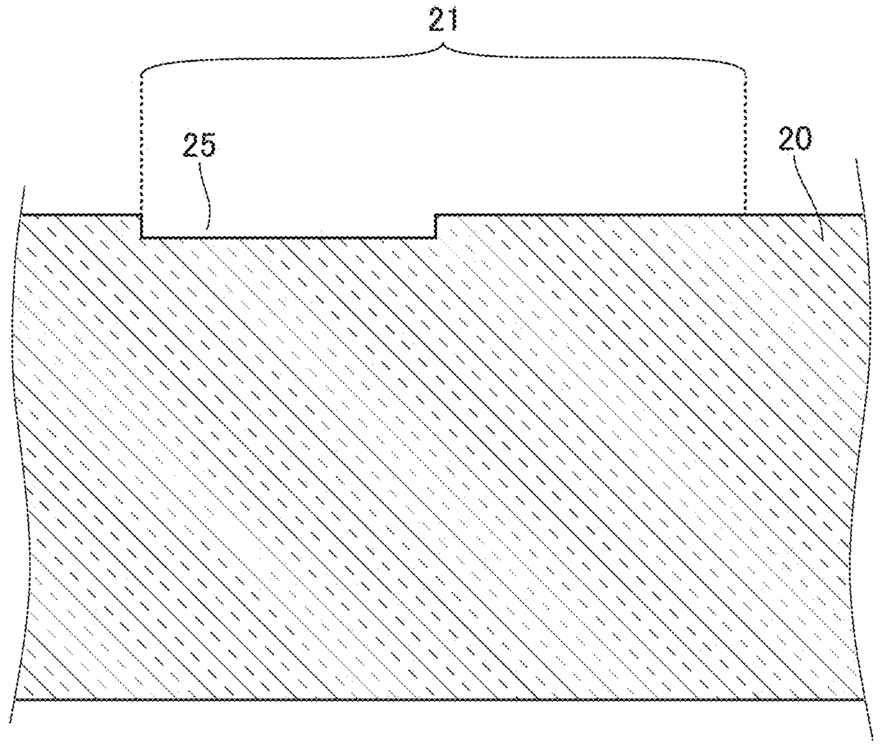
FIG. 4 is a cross-sectional view showing the state of the workpiece after the first radiation to the processing receiving region.

FIG. 3 shows an example of the radiation receiving region 22 in the first radiation to any of the processing receiving regions 21, and FIG. 4 is a cross-sectional view showing the state of the workpiece 20 after the first radiation to the processing receiving region 21. In the present example, the workpiece 20 is first so moved by the stage 350 that the radiation receiving region 22 abuts the edge of the processing receiving region 21 on one side in the X direction as shown in FIG. 3, and the surface of the workpiece 20 is irradiated with the laser light. The radiation receiving region 22 is therefore irradiated with the laser light, and a recess 25 is formed in the workpiece 20, as shown in FIG. 4.

Figure 5:
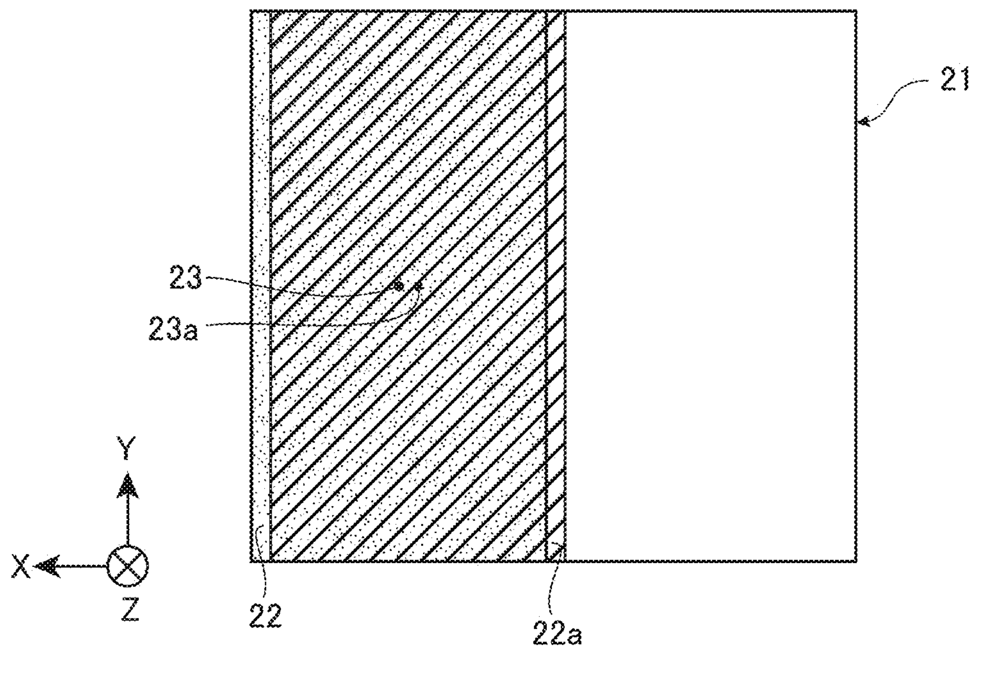
FIG. 5 shows an example of the radiation receiving region in the second radiation to the processing receiving region.
Figure 6:
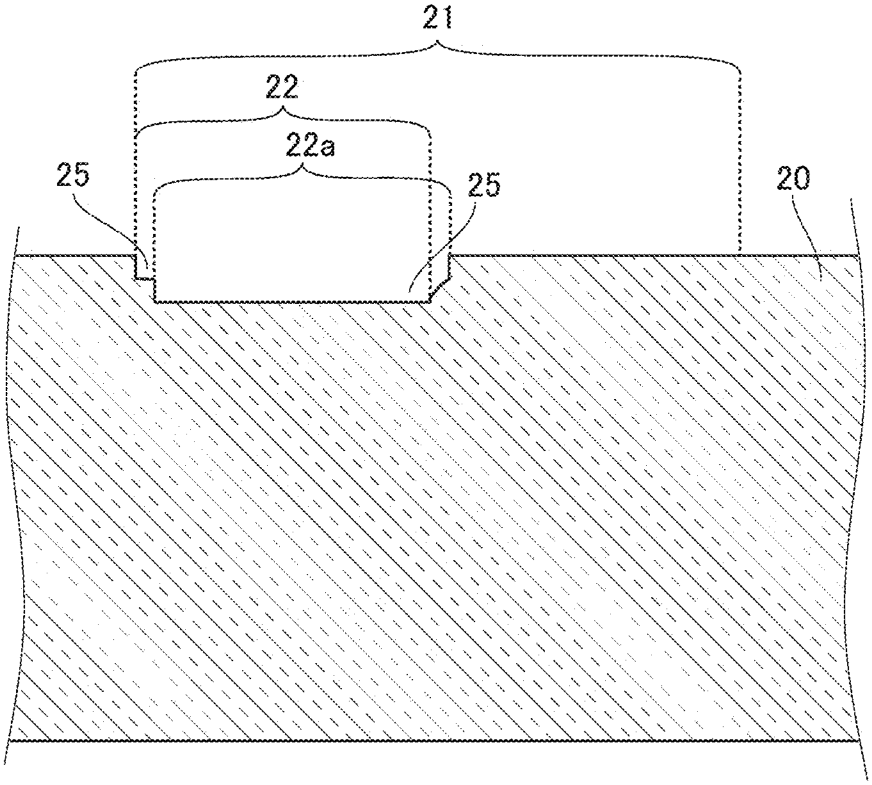
FIG. 6 is a cross-sectional view showing the state of the workpiece after the second radiation to the processing receiving region.

FIG. 5 shows an example of the radiation receiving region 22 in the second radiation to the processing receiving region 21, and FIG. 6 is a cross-sectional view showing the state of the workpiece 20 after the second radiation to the processing receiving region 21. After the first radiation to the processing receiving region 21, the workpiece 20 is moved by the stage 350 to the one side in the X direction, and the surface of the workpiece 20 is irradiated with the laser light, as shown in FIG. 5. A radiation receiving region 22*a* irradiated with the laser light in this process overlaps with a part of the radiation receiving region 22 irradiated with the laser light immediately before, and a center 23*a* of the radiation receiving region 22*a* is located at a position shifted from a center 23 of the radiation receiving region 22 toward the other side in the X direction. The radiation receiving region 22*a* is the result of moving the radiation receiving region 22*a*, with which the radiation receiving region 22 overlaps, in the widthwise direction of the outer shape of the laser light. The direction from the center 23*a* of the radiation receiving region 22*a* to the center 23 of the radiation receiving region 22, with which the radiation receiving region 22*a* overlaps, is the X direction, and the width of the processing receiving region 21 in the X direction is twice the width of the laser light in the widthwise direction. In FIG. 5, to distinguish the radiation receiving regions 22 and 22*a* from each other, the radiation receiving region 22 is hatched with the plural dots, and the radiation receiving region 22*a* is hatched with plural oblique lines.

Radiating the laser light to the radiation receiving region 22*a* forms another recess 25 in the workpiece 20, as shown in FIG. 6. Since the radiation receiving region 22*a* overlaps with a part of the radiation receiving region 22 irradiated with the laser light immediately before, a part of the edge of the radiation receiving region 22 is located within the radiation receiving region 22*a*. Corners are more readily processed with the laser light than planar portions. Therefore, the corners along the edge of the radiation receiving region 22 that is located within the radiation receiving region 22*a* are more readily processed than the other portions, and are therefore chamfered.

Figure 7:
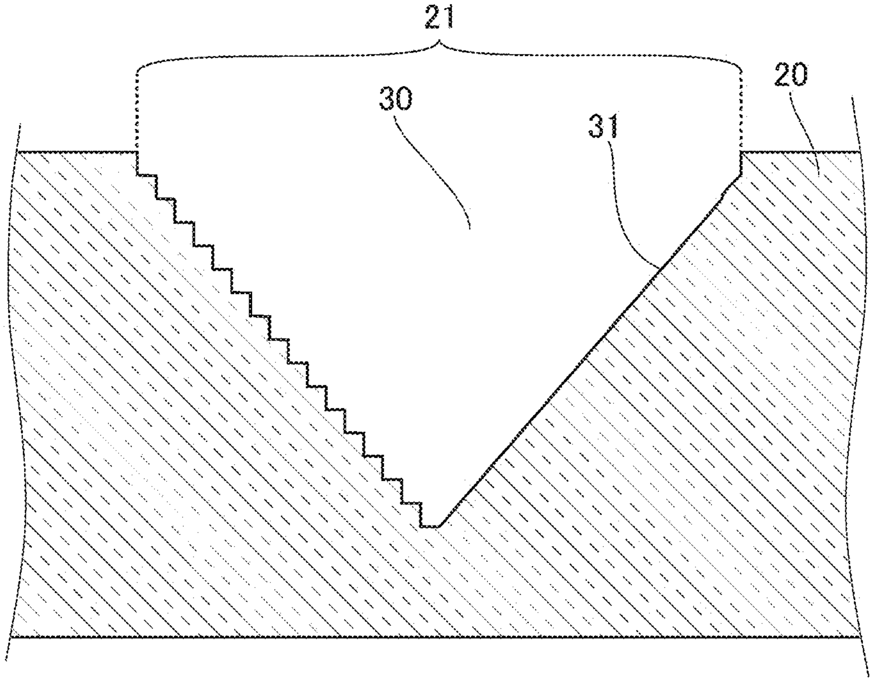
FIG. 7 is a cross-sectional view showing the state of the workpiece after the entire processing receiving region has been irradiated with laser light.

FIG. 7 is a cross-sectional view showing the state of the workpiece 20 after the entire processing receiving region 21 has been irradiated with the laser light. The movement of the radiation receiving region 22 irradiated with the laser light and the radiation of the laser light are repeated until the radiation receiving region 22 irradiated with the laser light abuts the edge of the processing receiving region 21 on the other side in the X direction to irradiate the entire processing receiving region 21 with the laser light. Thus forming plural recesses 25 forms recesses 30, one of which is shown in FIG. 7. As described above, corners are more readily processed with the laser light than planar portions, and portions of the recess 25 that face the edge on the other side in the X direction are irradiated with the laser light many times. Therefore, the portion of the recess 30 that abuts the edge on the other side in the X direction becomes a substantially flat inclining surface 31, and the portion of the recess 30 that abuts the edge on the one side in the X direction has a stepped shape. The inclining surface 31 is a surface at which a reflective film serving as a micromirror of the optical waveguide substrate is provided. In the present example, the recess 30 is not a through hole that passes to the rear surface of the workpiece 20, but may instead be a through hole.

The workpiece 20 is then so moved by the stage 350 that the radiation receiving region 22 abuts the edge of another processing receiving region 21 on one side in the X direction, and the radiation of the laser light and the movement of the radiation receiving region 22 described above are repeated. In the present example, the processing receiving region 21 irradiated with the laser light is changed to another along the line indicated by an arrow a, an arrow b, and an arrow c in this order shown in FIG. 2. Plural recesses 30 are thus formed in the workpiece 20. The direction in which the radiation receiving region 22 moves in each of the processing receiving regions 21 is the direction from one side toward the other side in the X direction. The inclining surface 31 of the recess 30 formed in each of the processing receiving regions 21 therefore inclines so as to approach the surface of the workpiece 20 as extending from the one side toward the other side in the X direction.

1.3 Problems

The travel distance of the radiation receiving region 22 between different processing receiving regions 21 is longer than the travel distance of the radiation receiving region 22 within a single processing receiving region 21. It therefore takes a long period to move the radiation receiving region 22 between the processing receiving regions 21, resulting in a long processing period.

To address the problem described above, a laser processing system 10 and a laser processing method that can shorten the processing period will be described by way of example in the following embodiments.

2. Description of Laser Processing System and Laser Processing Method According to First Embodiment The laser processing system 10 and the laser processing method according to a first embodiment will be described. The same components as those described above have the same reference characters, and duplicate description of the same components will be omitted unless otherwise particularly described.

2.1 Configuration

Figure 8:
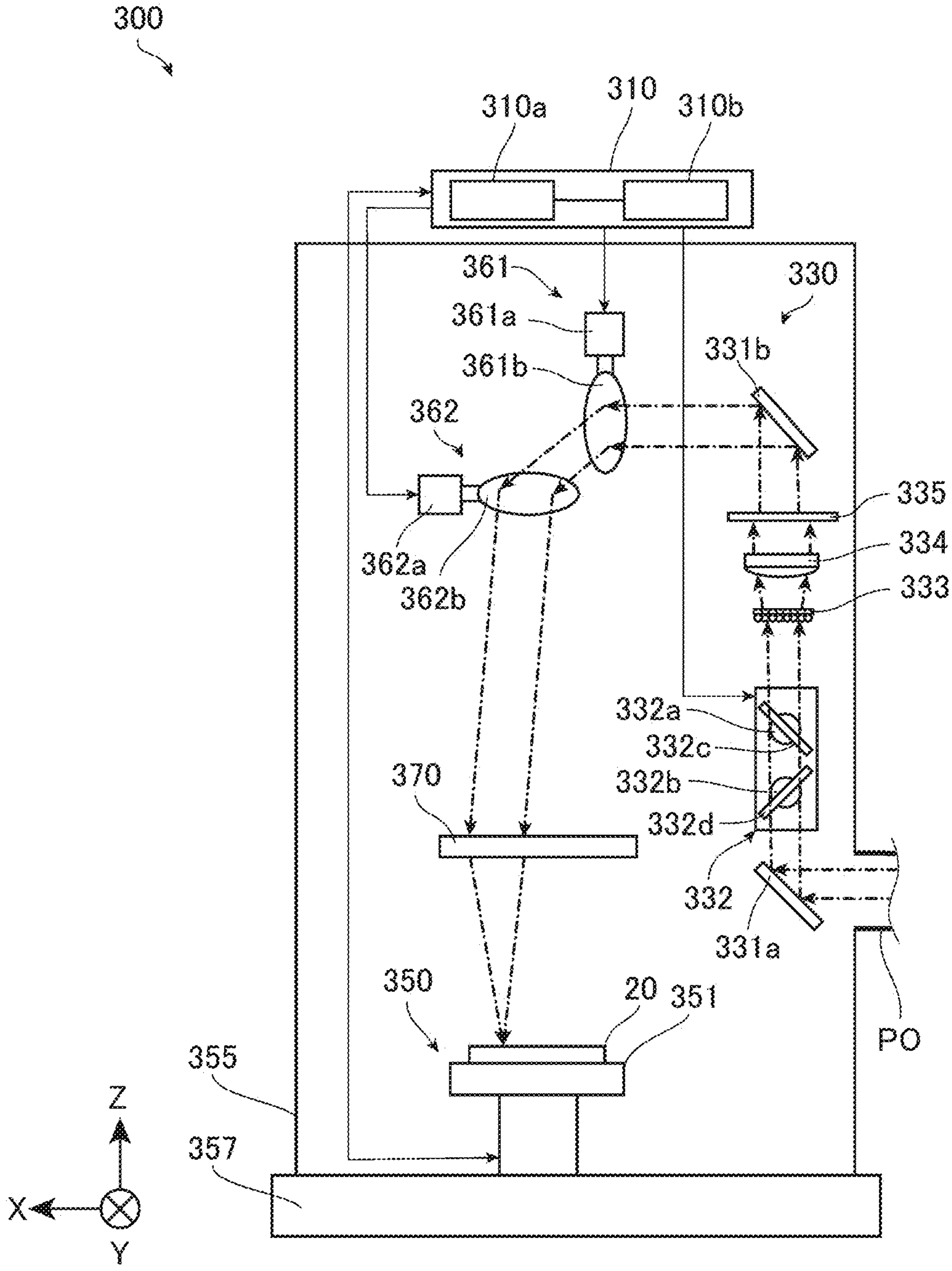
FIG. 8 is a diagrammatic view showing an example of a schematic configuration of a laser processing apparatus according to a first embodiment.

FIG. 8 is a diagrammatic view showing an example of a schematic configuration of the laser processing apparatus 300 according to the present embodiment. In the laser processing apparatus 300 according to the present embodiment, the arrangement of the fly-eye lens 333, the condenser lens 334, and the mask 335 differs from the arrangement in the laser processing apparatus 300 according to Comparative Example, as shown in FIG. 8. The laser processing apparatus 300 according to the present embodiment includes a galvanometric scanner 361 as a first galvanometric scanner and a galvanometric scanner 362 as a third galvanometric scanner in place of the highly reflective mirror 331*c*, and further includes an fθ lens 370 in place of the projection optical system 336.

The fly-eye lens 333, the condenser lens 334, and the mask 335 are arranged in the optical path between the attenuator 332 and the highly reflective mirror 331*b*.

The galvanometric scanner 361 includes a driver 361*a* and a mirror 361*b*, which is attached to a swing shaft of the driver 361*a* and is swingable around the swing shaft. The galvanometric scanner 362 has a configuration that is the same as the configuration of the galvanometric scanner 361, and includes a driver 362*a* and a mirror 362*b*, which is attached to a swing shaft of the driver 362*a* and is swingable around the swing shaft.

The drivers 361*a* and 362*a* are, for example, motors, and are electrically connected to the laser processing processor 310. The swing speeds and swing angles of the swing shafts of the drivers 361*a* and 362*a* are controlled by control signals from the laser processing processor 310. The swing shaft of the driver 361*a* is perpendicular to the swing shaft of the driver 362*a*.

The mirror 361*b* reflects the laser light from the highly reflective mirror 331*b* toward the mirror 362*b*, and the mirror 362*b* reflects the laser light from the mirror 361*b* toward the fθ lens 370. The orientations of the mirrors 361*b* and 362*b* are adjusted by the swing angles of the respective swing shafts of the drivers 361*a* and 362*a*. The orientations of the mirrors 361*b* and 362*b* may be adjusted in synchronization with each other. The speeds of the swinging mirrors 361*b* and 362*b* are adjusted by the swing speeds of the swinging swing shafts of the drivers 361*a* and 362*a*.

The galvanometric scanner 361 can change the optical path of the laser light along the X direction with the aid of the mirror 361*b* to move the radiation receiving region 22 irradiated with the laser light in the X direction. The galvanometric scanner 362 can change the optical path of the laser light along the Y direction with the aid of the mirror 362*b* to move the radiation receiving region 22 irradiated with the laser light in the Y direction. That is, the galvanometric scanner 361 is a mover that can move the radiation receiving region 22 irradiated with the laser light in the X direction perpendicular to the laser light radiation direction. The galvanometric scanner 362 is a mover that can move the radiation receiving region 22 irradiated with the laser light in the Y direction perpendicular to the laser light radiation direction. The minimum travel distance of the radiation receiving region 22 that can be adjusted by the galvanometric scanner 361 is approximately equal to the minimum travel distance of the radiation receiving region 22 that can be adjusted by the galvanometric scanner 362. It is preferable that the minimum travel distance of the radiation receiving region 22 in the X direction that can be adjusted by the stage 350 is shorter than the minimum travel distance of the radiation receiving region 22 that can be adjusted by the galvanometric scanner 361. It is further preferable that the minimum travel distance of the radiation receiving region 22 in the Y direction that can be adjusted by the stage 350 is shorter than the minimum travel distance of the radiation receiving region 22 that can be adjusted by the galvanometric scanner 362. Note that the relationship described above between the former and latter minimum travel distance in terms of magnitude is not limited to a specific relationship.

The fθ lens 370 is fixed to a holder that is not shown in the optical path between the mirror 362*b* and the workpiece 20, and is disposed at a predetermined position in the enclosure 355. The optical axis of the fθ lens 370 extends along the Z direction. The fθ lens 370 collects the laser light radiated from the galvanometric scanner 362 and brings the collected laser light into focus at the surface of the workpiece 20 along the optical axis of the fθ lens 370.

2.2 Operation

The operation of the laser processing processor 310 in the present embodiment will next be described.

Figure 9:
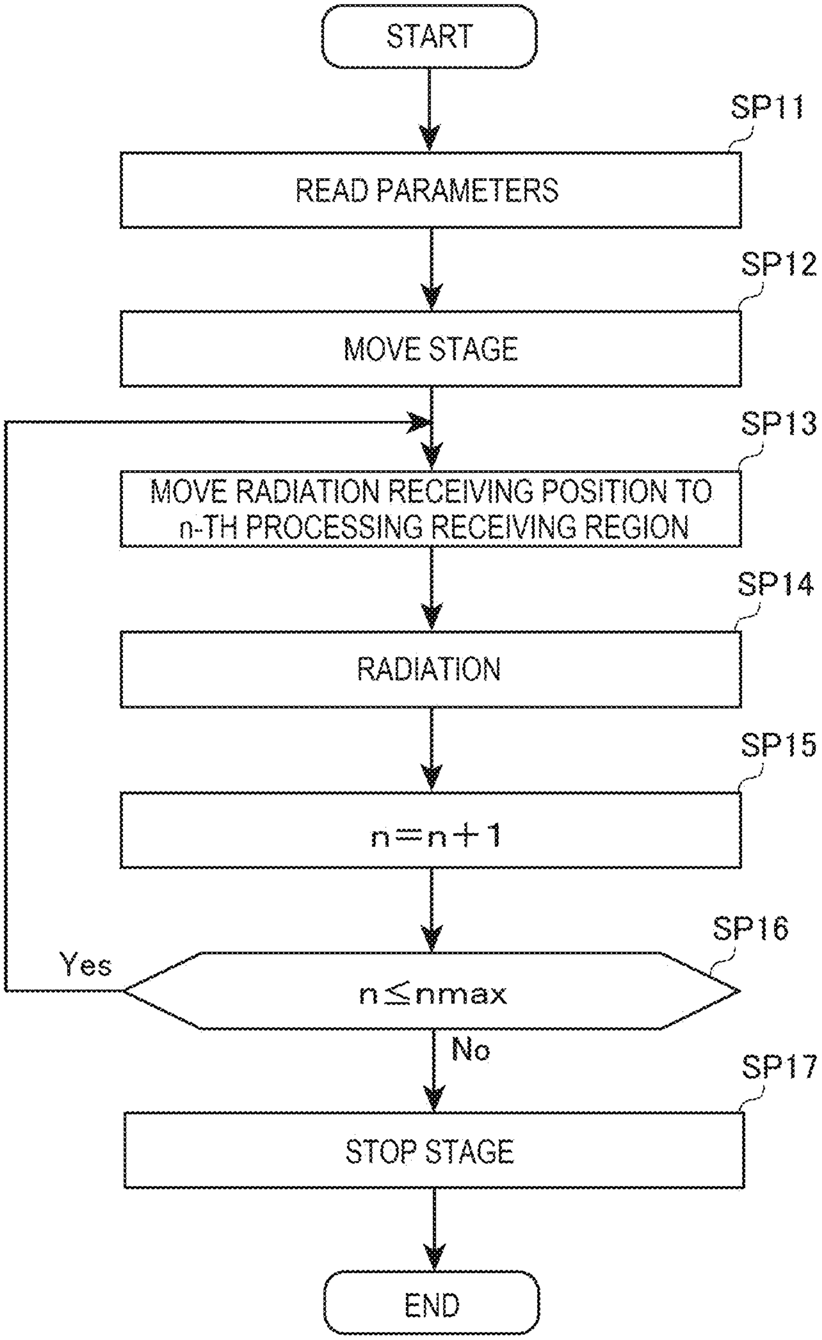
FIG. 9 is a flowchart of control performed by a laser processing processor in the first embodiment.

FIG. 9 is a flowchart of control performed by the laser processing processor 310 in the present embodiment. The control flowchart in the present embodiment includes steps SP11 to SP17 and shows the laser processing method for forming the plural recesses 30 in the workpiece 20.

In the starting state shown in FIG. 9, the laser processing processor 310 has received the reception preparation completion signal from the laser processor 190, but has not transmitted the light emission trigger Tr to the laser processor 190. Therefore, the laser light has been output from the laser oscillator 130, but has not entered the laser processing apparatus 300 from the gas laser apparatus 100 because the shutter 170 is closed. Furthermore, in the starting state, the workpiece 20 has been already supported by the table 351.

Step SP11

This step is a preparation step before the laser processing apparatus 300 starts actual operation. In this step, the laser processing processor 310 reads parameters from the storage 310*a*. The parameters in the present embodiment include the number nmax of processing receiving regions 21, the maximum number of times mmax each of the processing receiving regions 21 is irradiated with the laser light, the number n, and the coordinates of each of the processing receiving regions 21.

The processing receiving regions 21 are numbered from 1 to nmax. The number n is the number of the processing receiving regions 21, and the initial value of n is one. In the present embodiment, the number successively increases along the line indicated by the arrow a, the arrow b, and the arrow c in this order shown in FIG. 2. The coordinates of each of the processing receiving region 21 are the XY coordinates of the center 23 of the radiation receiving region 22 that abuts the edge of the processing receiving region 21 on one side in the X direction, as shown in FIG. 3.

Step SP12

This step is the step of moving the table 351 of the stage 350. In this step, the laser processing processor 310 controls the stage 350 in such a way that the table 351 moves at a constant speed from the other side to the one side in the X direction. The control described above continues until step SP16. After starting the control, the laser processing processor 310 proceeds to step SP13 in the control flowchart.

Step SP13

This step is the step of moving a radiation receiving position irradiated with the laser light. In this step, the laser processing processor 310 controls the galvanometric scanners 361 and 362 in such a way that the coordinates of the radiation receiving position become the coordinates of the processing receiving region 21 having the number n. The coordinates of the radiation receiving position are the XY coordinates of the center 23 of the radiation receiving region 22 irradiated with the laser light. After moving the radiation receiving position, the laser processing processor 310 proceeds to step SP14 in the control flowchart.

Step SP14

This step is the step of irradiating the workpiece 20 with the laser light for a predetermined period. In this step, the laser processing processor 310 transmits the light emission trigger Tr to the laser processor 190 to cause the laser processor 190 to open the shutter 170. The laser light thus enters the laser processing apparatus 300 from the gas laser apparatus 100. The laser light having entered the laser processing apparatus 300 sequentially travels via the highly reflective mirror 331*a*, the attenuator 332, the condenser lens 334 the mask 335, the highly reflective mirror 331*b*, the mirror 361*b*, the mirror 362*b*, and the fθ lens 370, and is radiated to the workpiece 20. The workpiece 20 is processed by the laser light radiated thereto. During this step, since the table 351 moves at a constant speed from the other side to the one side in the X direction, the workpiece 20 also moves at the constant speed from the other side to the one side in the X direction. The radiation receiving region 22 therefore moves toward the other side in the X direction as the time elapses. In the present embodiment, the period for which the laser light is radiated is so adjusted that the radiation receiving region 22 overlaps a part of the radiation receiving region 22 irradiated with the laser light immediately before, and that the mmax-th radiation receiving region 22 abuts the edge of the processing receiving region 21 on the other side in the X direction. The stage 350 therefore moves the radiation receiving region 22 in such a way that the moved radiation receiving region 22 overlaps with a part of the radiation receiving region 22 irradiated with the laser light immediately before. The movement described above is a first process of causing the stage 350 capable of moving the radiation receiving region 22 in the X direction to move the radiation receiving region 22 so as to overlap with a part of the radiation receiving region 22 irradiated with the laser light immediately before, and the first process and the laser light radiation are repeated. Radiating the laser light mmax times causes the entire processing receiving region 21 to be irradiated with the laser light, and the recess 30 is formed in the processing receiving region 21. After performing the mmax-th laser light radiation, the laser processing processor 310 proceeds to step SP15 in the control flowchart.

Step SP15

This step is the step of incrementing the number n by one. In this step, the laser processing processor 310 rewrites the number n to n+1 and proceeds to step SP16 in the control flowchart.

Step SP16

This step is the step of selecting the following step from different steps in accordance with the number n. In this step, the laser processing processor 310 returns to step SP13 in the control flowchart when the number n is smaller than or equal to nmax, and proceeds to step SP17 in the control flowchart when the number n is greater than nmax. When there is a processing receiving region 21 that has not been irradiated with the laser light, the galvanometric scanners 361 and 362 move the radiation receiving region 22 in such a way that the moved radiation receiving region 22 is located within a processing receiving region 21 different from the processing receiving region 21 irradiated with the laser light immediately before. The movement of the radiation receiving region 22 between the processing receiving regions 21 is performed along the line indicated by the arrow a, the arrow b, and the arrow c in this order shown in FIG. 2. The movement between the processing receiving regions 21 indicated by the arrows a and c is movement between the processing receiving regions 21 separate from each other in the X direction. The movement described above is a second process of causing the galvanometric scanner 361 to move the radiation receiving region 22 in such a way that the moved radiation receiving region 22 is located within a processing receiving region 21 different from the processing receiving region 21 irradiated with the pulse laser light immediately before. The movement between the processing receiving regions 21 indicated by the arrow b is movement between the processing receiving regions 21 located at positions different from each other both in the X and Y directions, and the radiation receiving region 22 is moved in this case by the galvanometric scanners 361 and 362.

Step SP17

This step is the step of stopping the movement of the table 351 of the stage 350. This step is carried out when the number n is greater than nmax in step SP15, and is carried out after all the processing receiving regions 21 are irradiated with the laser light. In this step, the laser processing processor 310 controls the stage 350 to stop the movement of the table 351. The recesses 30 are formed in all the processing receiving regions 21, and the processing of the workpiece 20 is completed.

2.3 Effects and Advantages

The laser processing method according to the present embodiment includes the first and second processes. In the first process, the stage 350 capable of moving the radiation receiving region 22 in the X direction moves the radiation receiving region 22 so as to overlap with a part of the radiation receiving region 22 irradiated with the pulse laser light immediately before. In the second process, the galvanometric scanner 361 capable of moving the radiation receiving region 22 in the X direction moves the radiation receiving region 22 in such a way that the moved radiation receiving region 22 is located within a processing receiving region 21 different from the processing receiving region 21 irradiated with the pulse laser light immediately before. In the laser processing system 10 according to the present embodiment, the stage 350 moves the radiation receiving region 22 in such a way that the moved radiation receiving region 22 overlaps with a part of the radiation receiving region 22 irradiated with the pulse laser light immediately before. The galvanometric scanner 361 moves the radiation receiving region 22 in such a way that the moved radiation receiving region 22 is located within a processing receiving region 21 different from the processing receiving region 21 irradiated with the pulse laser light immediately before. The galvanometric scanner 361, which changes the optical path of the pulse laser light to move the radiation receiving region 22, can reduce the period required to move the radiation receiving region 22 as compared with the stage 350, which moves the table 351, which supports the workpiece 20, to move the radiation receiving region 22. The laser processing method and the laser processing system 10 according to the present embodiment can therefore shorten the processing period as compared with the case where the stage 350 moves the radiation receiving region 22 between different processing receiving regions 21.

Furthermore, the laser processing method and the laser processing system 10 according to the present embodiment allow the galvanometric scanner 361 to move the radiation receiving region 22 between the processing receiving regions 21 separate from each other in the X direction even when the workpiece 20 is moved by the stage 350 in the X direction.

In the laser processing method and the laser processing system 10 according to the present embodiment, the two processing receiving regions 21 in each of the sets 26, which each include processing receiving regions 21, are separate from each other in the X direction. The direction in which the radiation receiving region 22 moves in each of the processing receiving regions 21 is the direction from one side toward the other side in the X direction. The inclining surface 31 of the recess 30 formed in each of the processing receiving regions 21 therefore inclines so as to approach the surface of the workpiece 20 as extending from the one side toward the other side in the X direction. The laser processing method and the laser processing system 10 according to the present embodiment are therefore particularly useful to manufacture an optical waveguide substrate in which micromirrors inclining as described above are arranged in the X direction.

The laser processing system 10 according to the present embodiment further includes the galvanometric scanner 362, which can move the radiation receiving region 22 in the Y direction perpendicular to the X direction. Therefore, even when the stage 350 moves the workpiece 20 in the X direction, the galvanometric scanners 361 and 362 can move the radiation receiving region 22 between the processing receiving regions 21 located at positions different from each other in the Y direction.

In the laser processing method according to the present embodiment, the stage 350 moves the workpiece 20 at a constant speed in the X direction until the processing of all the processing receiving regions 21 is completed. In the second process described above, however, the stage 350 may not move the workpiece 20 in the X direction. Furthermore, the order of processing receiving regions 21 to be irradiated with the laser light is not limited to a specific order.

3. Description of Laser Processing System and Laser Processing Method According to Second Embodiment The laser processing system 10 and the laser processing method according to a second embodiment will next be described. The same components as those described above have the same reference characters, and duplicate description of the same components will be omitted unless otherwise particularly described.

3.1 Configuration

Figure 10:
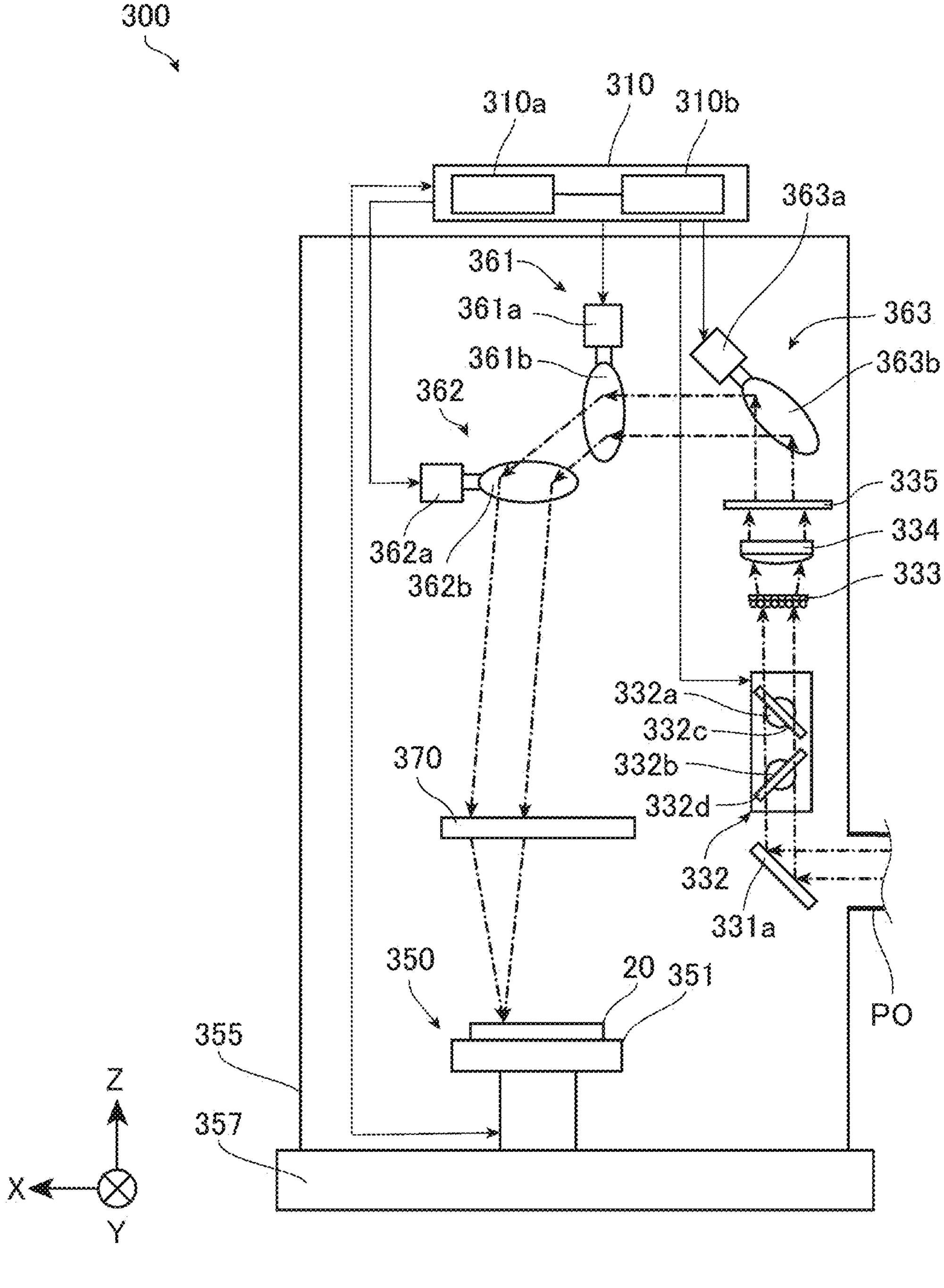
FIG. 10 is a diagrammatic view showing an example of a schematic configuration of the laser processing apparatus according to a second embodiment.

FIG. 10 is a diagrammatic view showing an example of a schematic configuration of the laser processing apparatus 300 according to the present embodiment. The laser processing apparatus 300 according to the present embodiment differs from the laser processing apparatus 300 according to the first embodiment in that a galvanometric scanner 363 as the second galvanometric scanner is provided in place of the highly reflective mirror 331*b*, as shown in FIG. 10.

The galvanometric scanner 363 is disposed in the optical path between the mask 335 and the galvanometric scanner 361, and located upstream from the galvanometric scanner 361 in the traveling direction of the laser light. The galvanometric scanner 363 includes a driver 363*a* and a mirror 363*b*, which is attached to a swing shaft of the driver 363*a* and is swingable around the swing shaft. The driver 363*a* can change the orientation of the mirror 363*b* as the driver 361*a* of the galvanometric scanner 361. The mirror 363*b* reflects the laser light from the mask 335 toward the mirror 361*b* of galvanometric scanner 361. The mirror 361*b* reflects the laser light from the mirror 363*b* toward the mirror 362*b* of the galvanometric scanner 362, and the mirror 362*b* reflects the laser light from the mirror 361*b* toward the fθ lens 370. The fθ lens 370 collects the laser light radiated from the galvanometric scanner 362 and brings the collected laser light into focus at the surface of the workpiece 20 along the optical axis of the fθ lens 370.

The galvanometric scanner 363 can change the optical path of the laser light along the X direction with the aid of the mirror 363*b* to move the radiation receiving region 22 irradiated with the laser light in the X direction. That is, the galvanometric scanner 363 is a mover that can move the radiation receiving region 22 irradiated with the laser light in the X direction. It is preferable that the minimum travel distance of the radiation receiving region 22 that can be adjusted by the galvanometric scanner 363 is shorter than the minimum travel distance of the radiation receiving region 22 that can be adjusted by the galvanometric scanner 361.

3.2 Operation

The operation of the laser processing processor 310 in the present embodiment will next be described.

Figure 11:
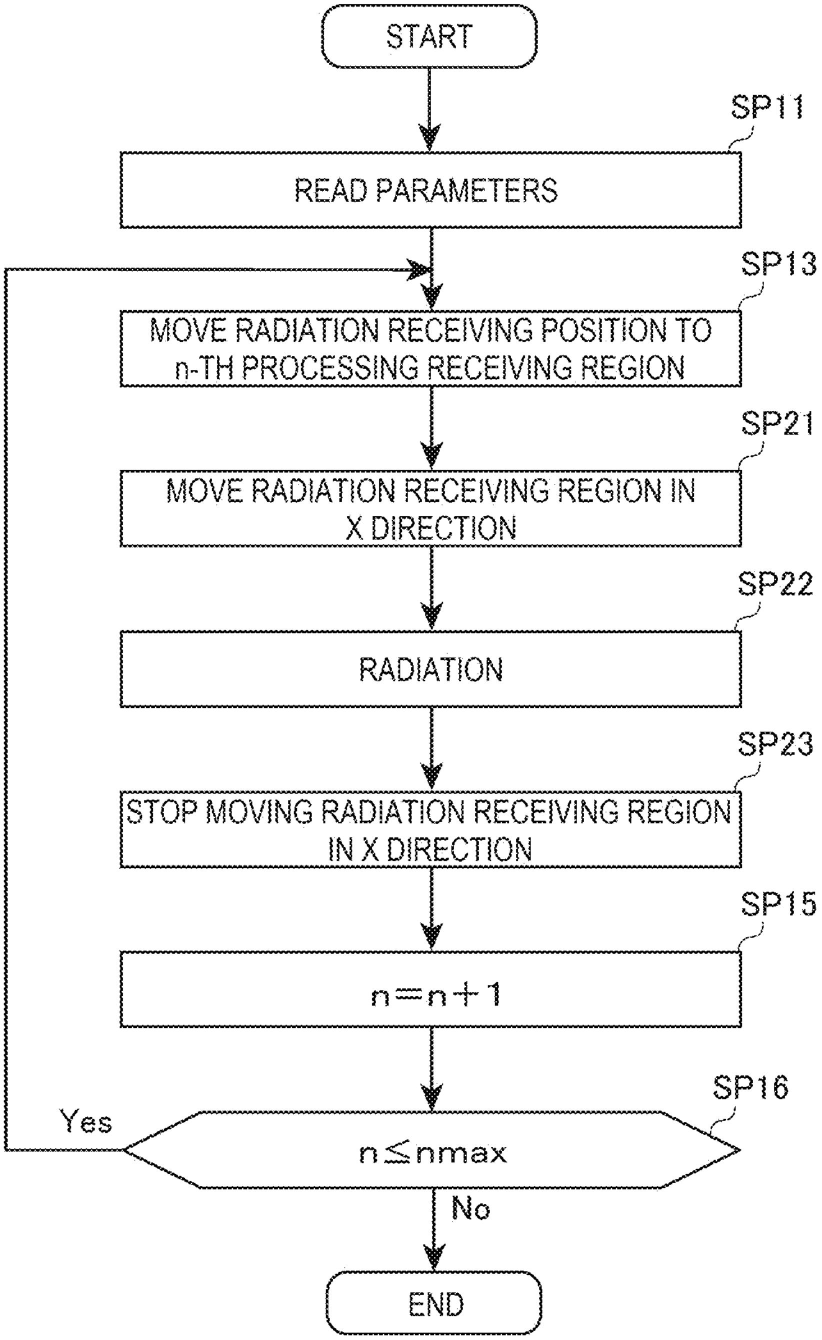
FIG. 11 is a flowchart of the control performed by the laser processing processor in the second embodiment.

FIG. 11 is a flowchart of control performed by the laser processing processor 310 in the present embodiment. The control flowchart in the present embodiment differs from the control flowchart in the first embodiment in that the former does not include step SP12, SP14, or SP17, but includes steps SP21, SP22, and SP23. Therefore, steps SP21, SP22, and SP23 will be described below, and the other steps will not be described as appropriate.

Step SP21

This step is a step performed when the coordinates of the radiation receiving position become the coordinates of the processing receiving region 21 having the number n, and is the step of causing the galvanometric scanner 363 to move the radiation receiving region 22 in the X direction. The radiation receiving region 22 at the start of this step therefore abuts the edge of the processing receiving region 21 having the number n on one side in the X direction. In this step, the laser processing processor 310 controls the galvanometric scanner 363 in such a way that the radiation receiving region 22 moves at a constant speed from the one side toward the other side in the X direction. The control described above continues until step SP23. After starting the control, the laser processing processor 310 proceeds to step SP22 in the control flowchart.

Step SP22

This step is the step of irradiating the workpiece 20 with the laser light for the predetermined period, as step SP14 in the first embodiment. In this step, the laser processing processor 310 transmits the light emission trigger Tr to radiate the laser light onto the workpiece 20. In this step, the radiation receiving region 22 moves toward the other side in the X direction as the time elapses. In the present embodiment, the period for which the laser light is radiated is so adjusted that the radiation receiving region 22 overlaps a part of the radiation receiving region 22 irradiated with the laser light immediately before, and that the mmax-th radiation receiving region 22 abuts the edge of the processing receiving region 21 on the other side in the X direction, as in the step SP14 in the first embodiment. The galvanometric scanner 363 therefore moves the radiation receiving region 22 in such a way that the moved radiation receiving region 22 overlaps with a part of the radiation receiving region 22 irradiated with the laser light immediately before. The movement described above is the first process of causing the galvanometric scanner 363 capable of moving the radiation receiving region 22 in the X direction to move the radiation receiving region 22 so as to overlap with a part of the radiation receiving region 22 irradiated with the laser light immediately before. Radiating the laser light mmax times causes the entire processing receiving region 21 to be irradiated with the laser light, and the recess 30 is formed in the processing receiving region 21. After performing the mmax-th laser light radiation, the laser processing processor 310 proceeds to step SP23 in the control flowchart.

Step SP22

This step is the step of causing the galvanometric scanner 363 to stop moving the radiation receiving region 22 in the X direction. In this step, the laser processing processor 310 controls the galvanometric scanner 363 to stop moving the radiation receiving region 22. After stopping the movement of the radiation receiving region 22, the laser processing processor 310 proceeds to step SP15 in the control flowchart.

3.3 Effects and Advantages

The laser processing method and the laser processing system 10 according to the present embodiment can shorten the processing period as compared with the case where the stage 350 moves the radiation receiving region 22 between different processing receiving regions 21, as the laser processing method and the laser processing system 10 according to the first embodiment. Furthermore, in the laser processing method and the laser processing system 10 according to the present embodiment, the galvanometric scanner 363 moves the radiation receiving region 22 in the X direction within each of the processing receiving regions 21, and the galvanometric scanner 361 moves the radiation receiving region 22 between the processing receiving regions 21 separate from each other in the X direction. The minimum travel distance of the radiation receiving region 22 moved by the galvanometric scanner 363, which moves the radiation receiving region 22 within each of the processing receiving regions 21, can therefore be smaller than in the case where the radiation receiving region 22 is moved by the single galvanometric scanner 361, so that the processing receiving region 21 can be processed with improved accuracy.

In the laser processing method according to the present embodiment, the galvanometric scanner 363 moves the radiation receiving region 22 in the X direction within each of the processing receiving regions 21, and the galvanometric scanners 361 and 362 move the radiation receiving region 22 between the processing receiving regions 21. The workpiece 20 can therefore be processed without moving the workpiece 20. For example, as compared with the case where the radiation receiving region 22 is moved between the processing receiving regions 21 while the workpiece 20 is moved at a constant speed in the X direction, the radiation receiving region 22 can be moved between the processing receiving regions 21 without synchronization with the movement of the workpiece 20, so that the processing accuracy can be improved.

The travel distance of the radiation receiving region 22 in the X direction in each of the processing receiving regions 21 is shorter than the travel distance of the radiation receiving region 22 between the processing receiving regions 21. The maximum amount of change in the optical path of the laser light caused by the galvanometric scanner 363 is therefore smaller than the maximum amount of change in the optical path of the laser light caused by the galvanometric scanner 361. In the present embodiment, since the galvanometric scanner 363 is located upstream from the galvanometric scanner 361 in the traveling direction of the laser light, the laser light is readily incident on the galvanometric scanner 361.

Note that the galvanometric scanner 363 may be located downstream from the galvanometric scanner 361 in the traveling direction of the laser light. Furthermore, in the present embodiment, since the workpiece 20 is not moved by the stage 350, the stage 350 may have a configuration in which the table 351 does not move.

4. Description of Laser Processing System and Laser Processing Method According to Third Embodiment The laser processing system 10 and the laser processing method according to a third embodiment will next be described. The same components as those described above have the same reference characters, and duplicate description of the same components will be omitted unless otherwise particularly described.

4.1 Configuration

Figure 12:
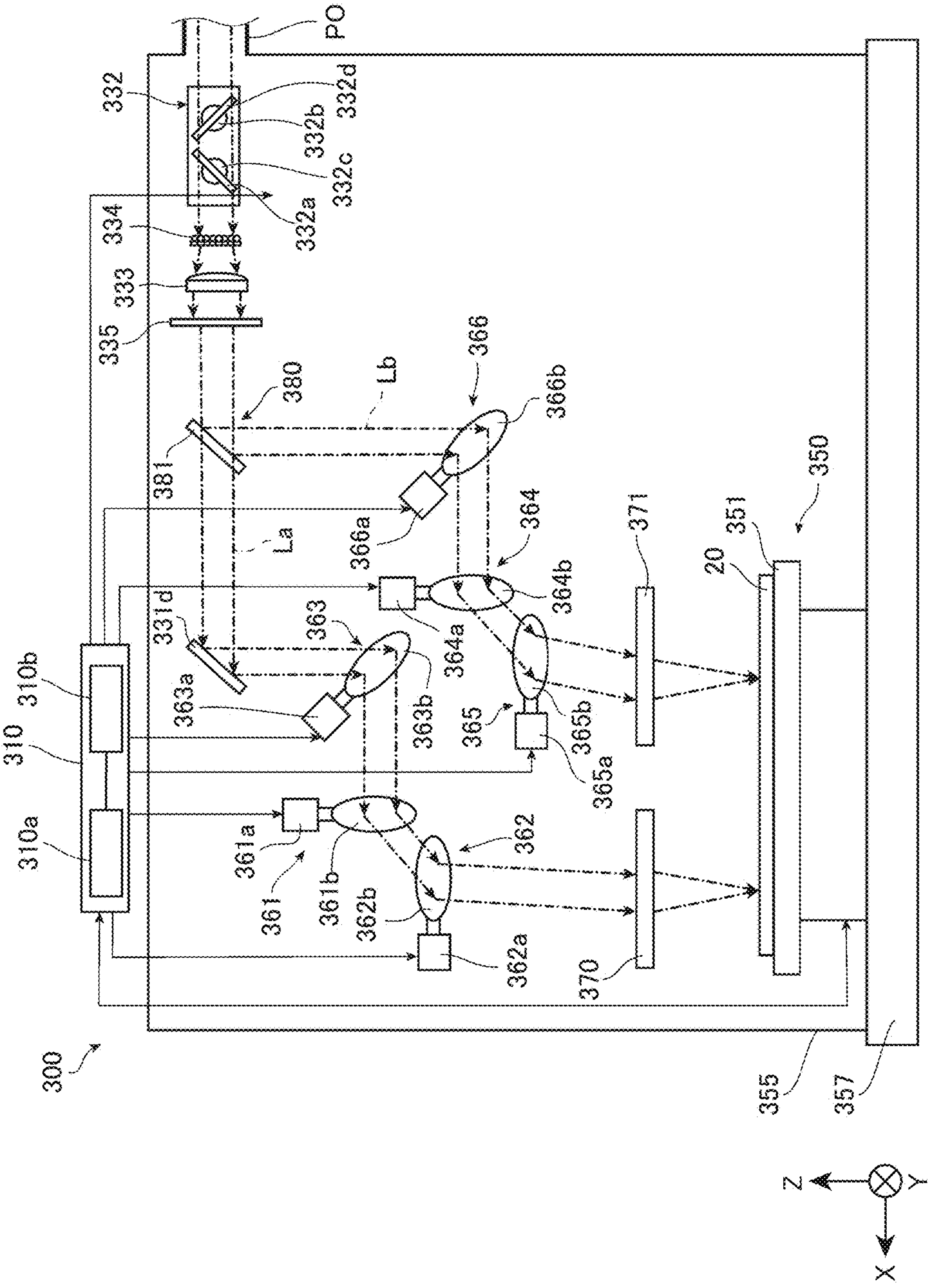
FIG. 12 is a diagrammatic view showing an example of a schematic configuration of the laser processing apparatus according to a third embodiment.

FIG. 12 is a diagrammatic view showing an example of a schematic configuration of the laser processing apparatus 300 according to the present embodiment. The laser processing apparatus 300 according to the present embodiment differs from the laser processing apparatus 300 according to the second embodiment in that a dividing optical system 380, a highly reflective mirror 331*d*, galvanometric scanners 364, 365, and 366, and an fθ lens 371 are further provided, as shown in FIG. 12.

The dividing optical system 380 is disposed in the optical path between the mask 335 and the highly reflective mirror 331*d*. The dividing optical system 380 includes, for example, a beam splitter 381, reflects part of the laser light from the mask 335 toward the galvanometric scanner 366, and transmits the remainder of the laser light. The dividing optical system 380 thus divides the laser light from the mask 335 into two types of laser light, laser light La and laser light Lb.

The configuration of the highly reflective mirror 331*d* is, for example, the same as the configuration of the highly reflective mirrors 331*a*, 331*b*, and 331*c*. The highly reflective mirror 331*d* reflects the laser light La having passed through the beam splitter 381 toward the galvanometric scanner 363. The mirror 363*b* of the galvanometric scanner 363 reflects the laser light La from the highly reflective mirror 331*d* toward the mirror 361*b*, and the mirror 361*b* reflects the laser light La from the mirror 363*b* toward the mirror 362*b*. The mirror 362*b* reflects the laser light La from the mirror 361*b* toward the fθ lens 370. That is, the galvanometric scanners 361, 362, and 363 are provided for the laser light La. The fθ lens 370 collects the laser light La radiated from the galvanometric scanner 362 and brings the collected laser light La into focus at the surface of the workpiece 20 along the optical axis of the fθ lens 370.

The configuration of the galvanometric scanners 364, 365, and 366 is the same as the configuration of the galvanometric scanners 361, 362, and 363, and the galvanometric scanners 364, 365, and 366 include drivers 364*a*, 365*a*, and 366*a* and mirrors 364*b*, 365*b*, and 366*b*. The mirror 366*b* reflects the laser light Lb reflected off the beam splitter 381 toward the mirror 364*b*, and the mirror 364*b* reflects the laser light Lb from the mirror 366*b* toward the mirror 365*b*. The mirror 365*b* reflects the laser light Lb from the mirror 364*b* toward the fθ lens 371. That is, the galvanometric scanners 364, 365, and 366 are provided for the laser light Lb.

The galvanometric scanner 364 can change the optical path of the laser light Lb along the X direction with the aid of the mirror 364*b* to move the radiation receiving region 22 irradiated with the laser light Lb in the X direction. The galvanometric scanner 366 can change the optical path of the laser light Lb along the X direction with the aid of the mirror 366*b* to move the radiation receiving region 22 irradiated with the laser light Lb in the X direction. That is, the galvanometric scanners 364 and 366 are each a mover that can move the radiation receiving region 22 irradiated with the laser light Lb in the X direction. The galvanometric scanner 365 can change the optical path of the laser light Lb along the Y direction with the aid of the mirror 365*b* to move the radiation receiving region 22 irradiated with the laser light Lb in the Y direction. That is, the galvanometric scanner 365 is a mover that can move the radiation receiving region 22 irradiated with the laser light Lb in the Y direction.

The configuration of the fθ lens 371 is the same, for example, as that of the fθ lens 370. The fθ lens 371 is disposed in the optical path between the mirror 365*b* and the workpiece 20, and the optical axis of the fθ lens 371 extends along the Z direction. The fθ lens 371 collects the laser light Lb radiated from the galvanometric scanner 365 and brings the collected laser light Lb into focus at the surface of the workpiece 20 along the optical axis of the fθ lens 371.

In the present embodiment, out of the plural processing receiving regions 21 shown in FIG. 2, the processing receiving regions 21 in one of the sets 26 are regions to be processed by the laser light La radiated from the f lens 370, and the processing receiving regions 21 in the other set 26 are regions to be processed by the laser light Lb radiated from the fθ lens 371. The number of processing receiving regions 21 in the one set 26 is equal to the number of processing receiving regions 21 in the other set 26.

4.2 Operation

The operation of the laser processing processor 310 in the present embodiment will next be described.

The flowchart of the control performed by the laser processing processor 310 in the present embodiment is the same as the control flowchart in the second embodiment shown in FIG. 11. Steps SP13, SP21, SP22, and SP23 in the present embodiment, however, differ in operation from steps SP13, SP21, SP22, and SP23 in the second embodiment. Therefore, steps SP13, SP21, SP22, and SP23 will be described below, and the other steps will not be described as appropriate.

In the present embodiment, the number nmax of processing receiving regions 21, the number n, and the coordinates of each of the processing receiving regions 21 are set for each of the sets 26 of processing receiving regions 21. The number nmax of processing receiving regions 21 and the maximum number of times mmax the processing receiving regions 21 is irradiated with the laser light are the same in both the sets 26 of processing receiving regions 21.

Step SP13

In this step in the present embodiment, the laser processing processor 310 controls the galvanometric scanners 361 and 362 in such a way that the coordinates of the radiation receiving position irradiated with the laser light La become the coordinates of the processing receiving region 21 having the number n. The laser processing processor 310 controls the galvanometric scanners 364 and 365 in such a way that the coordinates of the radiation receiving position irradiated with the laser light Lb become the coordinates of the processing receiving region 21 having the number n. After moving the radiation receiving position, the laser processing processor 310 proceeds to step SP21 in the control flowchart.

Step SP21

In this step in the present embodiment, the laser processing processor 310 controls the galvanometric scanner 363 in such a way that the radiation receiving region 22 irradiated with the laser light La moves at a constant speed from the one side toward the other side in the X direction. The laser processing processor 310 controls the galvanometric scanner 366 in such a way that the radiation receiving region 22 irradiated with the laser light Lb moves at the constant speed from the one side toward the other side in the X direction. The control described above continues until step SP23. After starting the control described above, the laser processing processor 310 proceeds to step SP22 in the control flowchart.

Step SP22

In this step in the present embodiment, the laser processing processor 310 transmits the light emission trigger Tr to radiate the laser light La and the laser light Lb onto the workpiece 20, as in step SP22 in the second embodiment. The laser processing apparatus 300 in the present embodiment includes the dividing optical system 380. Therefore, the laser light La and the laser light Lb, into which the original laser light is divided by the dividing optical system 380, are simultaneously radiated to two of the plural processing receiving regions 21, and the simultaneous radiation for the predetermined period is repeated. In this step, the radiation receiving region 22 irradiated with the laser light La and the radiation receiving region 22 irradiated with the laser light Lb move toward the other side in the X direction as the time elapses. The period for which the laser light La and the laser light Lb are radiated is adjusted as in step SP22 in the second embodiment. Therefore, the radiation receiving region 22 irradiated with the laser light La overlaps with a part of the radiation receiving region 22 irradiated with the laser light La immediately before, and the radiation receiving region 22 irradiated with the laser light Lb overlaps with a part of the radiation receiving region 22 irradiated with the laser light Lb immediately before. The radiation receiving region 22 irradiated with the mmax-th laser light La abuts the edge of the processing receiving region 21 on the other side in the X direction, and the radiation receiving region 22 irradiated with the mmax-th laser light Lb abuts the edge of the processing receiving region 21 on the other side in the X direction. That is, the galvanometric scanners 363 and 366 move the radiation receiving regions 22 irradiated with the laser light La and the laser light Lb in such a way that the moved radiation receiving regions 22 overlap with parts of the radiation receiving regions 22 irradiated with the laser light La and the laser light Lb immediately before. The movement described above is the same as that in the first process described in the second embodiment. After radiating the mmax-th laser light La and laser light Lb, the laser processing processor 310 proceeds to step SP23 in the control flowchart.

Step SP23

In this step in the present embodiment, the laser processing processor 310 controls the galvanometric scanners 363 and 366 to stop moving the radiation receiving regions 22 irradiated with the laser light La and the laser light Lb. After stopping the movement described above, the laser processing processor 310 proceeds to step SP15 in the control flowchart.

4.3 Effects and Advantages

The laser processing method and the laser processing system 10 according to the present embodiment can shorten the processing period as compared with the case where the stage 350 moves the radiation receiving region 22 between different processing receiving regions 21, as the laser processing method and the laser processing system 10 according to the first embodiment.

In the laser processing method according to the present embodiment, two of the plural processing receiving regions 21 are simultaneously irradiated with the pulse laser light. The laser processing method according to the present embodiment can therefore further shorten the processing period.

Note that the dividing optical system 380 may divide the laser light from the mask 335 into three or more types of laser light, and in this case, for example, three galvanometric scanners are provided for each of the three or more types of laser light into which the optical laser light is divided. In the configuration described above, three or more of the plural processing receiving regions 21 can be simultaneously irradiated with the pulse laser light. Note that it is preferable that the number of types of laser light into which the original laser light is divided is smaller than or equal to half the number of processing receiving regions 21, and that the number of processing receiving regions 21 is an integral multiple of the number of types of laser light into which the original laser light is divided.

The laser processing apparatus 300 may not include the galvanometric scanner 363 or 366. In this case, for example, the stage 350 moves the radiation receiving region 22 within each of the processing receiving regions 21 in the X direction.

The present disclosure has been described above with reference to the embodiments by way of example, and the embodiments described above can be modified as appropriate. For example, the laser light radiated to the workpiece 20 has a rectangular outer shape elongated in the Y direction, and may instead have a shape other than a rectangular shape, for example, a circular shape.

The laser processing apparatus 300 may not include the fθ lens 370 or 371.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined. The terms used throughout the present specification and the appended claims should be interpreted as non-limiting terms. For example, terms such as “comprise”, “include”, “have”, and “contain” should not be interpreted to be exclusive of other structural elements. Further, indefinite articles “a/an” described in the present specification and the appended claims should be interpreted to mean “at least one” or “one or more.” Further, “at least one of A, B, and C” should be interpreted to mean any of A, B, C, A+B, A+C, B+C, and A+B+C as well as to include combinations of any thereof and any other than A, B, and C.

What is claimed is:

1. A laser processing system for forming plural recesses by radiating pulse laser light to plural processing receiving regions separate from each other in a first direction on a surface of a workpiece, the system comprising:

- a gas laser apparatus configured to output the pulse laser light;
- a mover configured to move a radiation receiving region, where the pulse laser is radiated, on the surface that is irradiated with the pulse laser light in the first direction; and a first galvanometric scanner configured to change an optical path of the pulse laser light to move the radiation receiving region in the first direction, the mover moving the radiation receiving region within the processing receiving region, in such a way that the radiation receiving region moved by the mover partially overlaps with a previous radiation receiving region that has been irradiated with the pulse laser light at a previous time in the processing receiving region, and the first galvanometric scanner moving the radiation receiving region from one processing receiving region to the other processing receiving region which is separated from the one processing receiving region, in such a way that the radiation receiving region moved by the first galvanometric scanner is located within the other processing receiving region different from the one processing receiving region that has been processed with the pulse laser light at a previous time.

2. The laser processing system according to claim 1, wherein the mover is a stage including a table configured to support the workpiece and move the workpiece in the first direction.

3. The laser processing system according to claim 1, wherein the mover is a second galvanometric scanner configured to change the optical path of the pulse laser light to move the radiation receiving region in the first direction.

4. The laser processing system according to claim 3, wherein the second galvanometric scanner is located upstream from the first galvanometric scanner in a traveling direction of the pulse laser light.

5. The laser processing system according to claim 4, wherein a minimum travel distance of the radiation receiving region that the second galvanometric scanner is configured to adjust is shorter than the minimum travel distance of the radiation receiving region that the first galvanometric scanner is configured to adjust.

6. The laser processing system according to claim 1, further comprising a third galvanometric scanner configured to change the optical path of the pulse laser light in such a way that the radiation receiving region moves in a second direction perpendicular to the first direction, to move the radiation receiving region in the second direction.

7. The laser processing system according to claim 6, wherein a minimum travel distance of the radiation receiving region that the mover is configured to adjust is shorter than the minimum travel distance of the radiation receiving region that the third galvanometric scanner is configured to adjust.

8. The laser processing system according to claim 1, further comprising a dividing optical system configured to divide the pulse laser light into plural kinds of pulse laser light, wherein the first galvanometric scanner is provided for each of the plural kinds of pulse laser light into which the original pulse laser light is divided.

9. The laser processing system according to claim 1, wherein the workpiece is a light-transmissive, plate-shaped member that forms a light waveguide substrate.

10. The laser processing system according to claim 9, wherein a material of which the plate-shaped member is made is polyimide resin or polynorbornene resin.

11. The laser processing system according to claim 1, further comprising an fθ lens configured to collect the pulse laser light and bring the collected pulse laser light into focus at the surface of the workpiece.

12. A laser processing method for forming plural recesses by radiating pulse laser light to plural processing receiving regions separate from each other in a first direction on a surface of a workpiece, the method comprising:

a first process of causing a mover configured to move in the first direction a radiation receiving region, where the pulse laser is radiated, on the surface that is irradiated with the pulse laser light to move the radiation receiving region within the processing receiving region, in such a way that the radiation receiving region moved by the mover partially overlaps with a previous radiation receiving region that has been irradiated with the pulse laser light at a previous time in the processing receiving region; and a second process of causing a first galvanometric scanner configured to change an optical path of the pulse laser light to move the radiation receiving region from one processing receiving region to the other processing receiving region which is separated from the one processing receiving region, in the first direction to move the radiation receiving region in such a way that the moved radiation receiving region moved by the first galvanometric scanner is located within the other processing receiving region different from the one processing receiving region that has been processed with the pulse laser light at a previous time.

13. The laser processing system according to claim 1, wherein the first galvanometric scanner moves the radiation receiving region from the one processing receiving region, which is processed with the pulse laser light in the previous time, to the other processing receiving region, which is not processed with the pulse laser light.

* * * * *